US012141230B2

(12) United States Patent
Nahas et al.

(10) Patent No.: US 12,141,230 B2
(45) Date of Patent: *Nov. 12, 2024

(54) PROCESS ABNORMALITY IDENTIFICATION USING MEASUREMENT VIOLATION ANALYSIS

(71) Applicant: Applied Materials, Inc., Santa Clara, CA (US)

(72) Inventors: Selim Nahas, Newton, MA (US); Joseph James Dox, Boxford, MA (US); Vishali Ragam, Chantilly, VA (US); Eric J. Warren, Malta, NY (US); Shijing Wang, Sandy, UT (US); Charles Largo, Saratoga Springs, NY (US); Christopher Reeves, Clifton Park, NY (US); Randy Raynaldo Corral, Glbert, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/978,075

(22) Filed: Oct. 31, 2022

(65) Prior Publication Data
US 2023/0052392 A1     Feb. 16, 2023

Related U.S. Application Data

(63) Continuation of application No. 17/163,101, filed on Jan. 29, 2021, now Pat. No. 11,487,848.

(51) Int. Cl.
*G06F 17/18* (2006.01)
*G05B 19/418* (2006.01)
*H01L 21/67* (2006.01)

(52) U.S. Cl.
CPC ....... *G06F 17/18* (2013.01); *G05B 19/41875* (2013.01); *H01L 21/67253* (2013.01)

(58) Field of Classification Search
CPC .............. G06F 17/18; G05B 19/41875; H01L 21/67253
See application file for complete search history.

(56) References Cited

U.S. PATENT DOCUMENTS

2003/0011786 A1    1/2003 Levy
2005/0187648 A1    8/2005 Tai
(Continued)

FOREIGN PATENT DOCUMENTS

JP        H0778019 A       3/1995
JP      2000243794 A       9/2000
(Continued)

OTHER PUBLICATIONS

JP 2014213429 A machine translation, downloaded Feb. 2022. (Year: 2022).*

(Continued)

*Primary Examiner* — John C Kuan
(74) *Attorney, Agent, or Firm* — Lowenstein Sandler LLP

(57) ABSTRACT

The subject matter of this specification can be implemented in, among other things, a method, system, and/or device to receive current metrology data for an operation on a current sample in a fabrication process. The metrology data includes a current value for a parameter at each of one or more locations on the current sample. The method further includes determining a current rate of change of the parameter value for each of the one or more locations. The current rate of change is associated with the current sample. The method further includes identifying one or more violating locations each having an associated current rate of change of the parameter value that is greater than an associated reference rate of change of the parameter value, and identifying an instance of abnormality of the fabrication process based on the one or more violating locations.

20 Claims, 7 Drawing Sheets

(56) References Cited

U.S. PATENT DOCUMENTS

2006/0142965 A1    6/2006  Minor
2009/0297019 A1   12/2009  Zafar
2021/0008774 A1    1/2021  Kruppa

FOREIGN PATENT DOCUMENTS

JP      2001217169 A    8/2001
JP      2014213429 A   11/2014
KR     20190048071 A    5/2019

OTHER PUBLICATIONS

International Search Report and Written Opinion for PCT Patent Application No. PCT/US2022/012595, mailed May 4, 2022, 12 pgs.
Blue et al., "Run-To-Run Sensor Variation Monitoring for Process Fault Diagnosis in Semiconductor Manufacturing" Proceedings of the 2016 Winter Simulation Conference (Year: 2016).
Chien et al., "Analysing semiconductor manufacturing big data for root cause detection of excursion for yield enhancement" International Journal of Production Research, 2017 (Year: 2017).
Tsuda et al., "Advanced Semiconductor Manufacturing Using Big Data" IEEE Transactions on Semiconductor Manufacturing, vol. 28, No. 3, Aug. 2015 (Year: 2015).
Yang et al., "Similarity Ratio Analysis for Early Stage Fault Detection with Optical Emission Spectrometer in Plasma Etching Process" PLoS One 9(4): e95679. doi:10.1371/journal.pone.0095679 (2014) (Year: 2014).

* cited by examiner

PROCESS ABNORMALITY IDENTIFICATION USING MEASUREMENT VIOLATION ANALYSIS

RELATED APPLICATIONS

This application is a continuation application of co-pending U.S. patent application Ser. No. 17/163,101, filed Jan. 29, 2021, which is incorporated herein by reference.

TECHNICAL FIELD

Some embodiments of the present invention relate, in general, to systems, methods, and devices to detect abnormalities in a manufacturing system using sample measurement violation analysis.

BACKGROUND

In manufacturing, for example in semiconductor device fabrication, product quality can be measured directly using metrology tools and indirectly by monitoring process equipment sensors. This information is collected at different times in the product manufacturing lifecycle. When a manufacturing engineer needs to identify a problem with a process tool or a resulting product, he or she has to go through a laborious and costly process of analyzing lots of data points (e.g. metrology data of many samples with various measured parameters). For example, when an engineer is notified of a potential problem with a product, the engineer has to review corresponding metrology data to find an alarming characteristic of the product. A common way of identifying metrology violations is using statistical process control (SPC).

Statistical process control (SPC) is a method of quality control which employs statistical methods to monitor and control a process. SPC can help to ensure that the process operates with controlled variation, producing more specification-conforming products with less waste (e.g., rework or scrap). SPC can be applied to various processes where the conforming product (e.g., product meeting specifications) output can be measured. SPC may include industry-standard methodology for measuring and controlling quality during the manufacturing process. Quality data in the form of product and process measurements may be obtained in real-time during manufacturing. The data can then be plotted on a graph with calculated control limits. Two limits often used to bound the data include, first, control limits, that can be determined by the capability of the process and, second, specification limits, that can be determined by a desired outcome (e.g., a range of measurements meeting certain specification requirements).

SUMMARY

A method and a system for identifying an instance (e.g. a source) of abnormality of a fabrication process. The method includes receiving current metrology data for an operation on a current sample in a fabrication process. The metrology data includes a current value for a parameter at each of one or more locations on the current sample as well as samples from prior metrology process steps. The method includes obtaining a reference rate of change of the parameter value of the parameter for each of the one or more locations. The method further includes determining a current rate of parameter change of the parameter for each of the one or more locations. The current rate of change is associated with the current sample. The method further includes comparing the current rate of change of the parameter value to the reference rate of change of the parameter value and identifying an instance of abnormality of the fabrication process based on the comparison.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
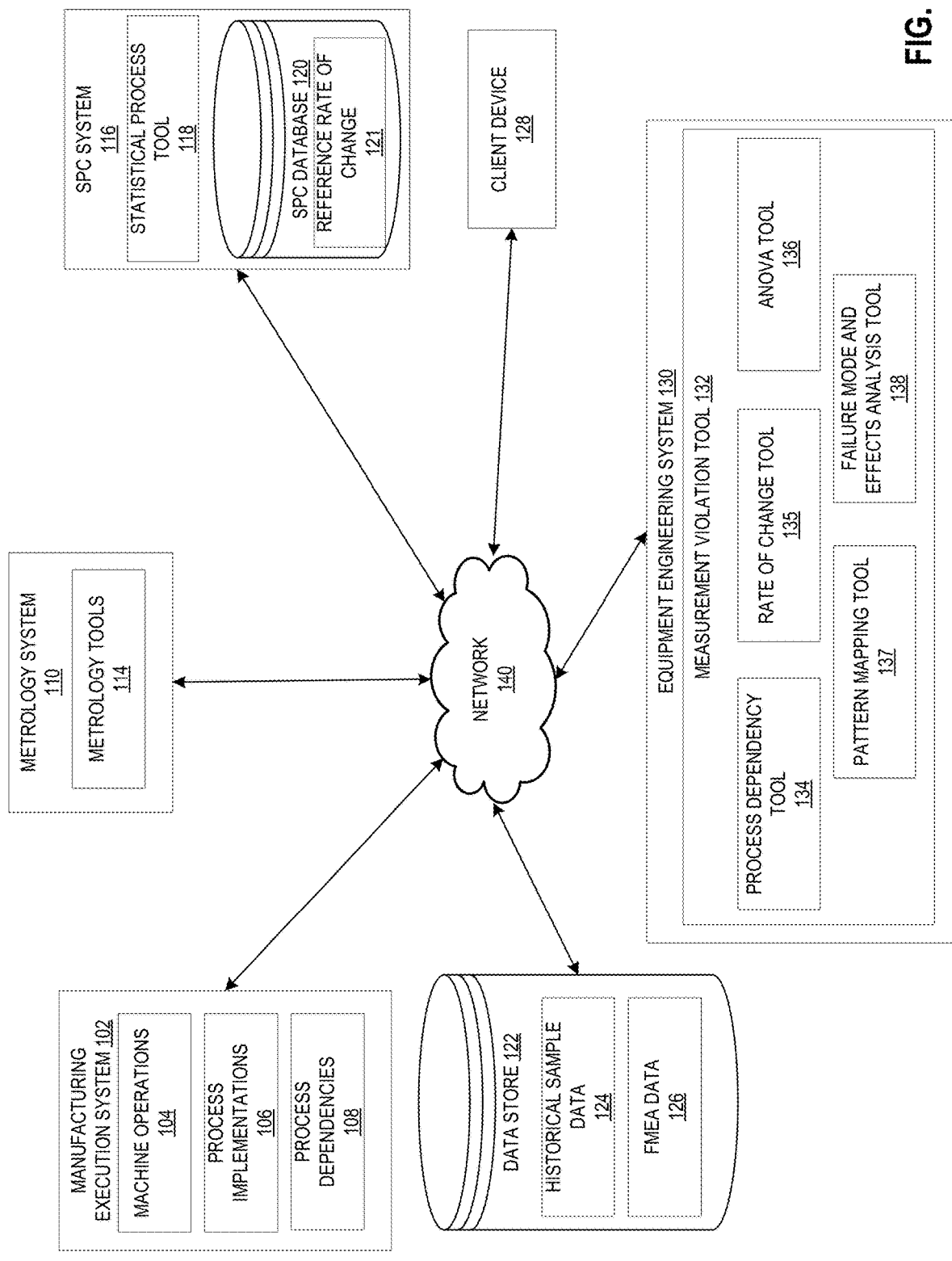
FIG. 1 is a block diagram illustrating a manufacturing system, according to aspects of the present disclosure.

In fabrication (e.g., micro-fabrication, waver manufacturing, substrate generation, and/or the like), various processing tools and procedures are used to create a desired outcome (e.g. a sample meeting a desired specification or having desired properties.) A fabrication process may include various manufacturing steps and metrology steps. Metrology steps can be used in between manufacturing steps to take metrology data that is indicative of the quality and success of the manufacturing step previously performed. The metrology data may consist of multiple measured parameter site values (e.g., thickness, roughness, depth, particle count, surface gradient, etc.) measured at various locations on a wafer comprising a sample. As a sample progresses through a fabrication process, historical metrology data can be taken from many metrology steps and stored to show how the sample has reached the current parameter values. A fabrication system may flag measurements that are in violation of a standard. For example, in SPC, a measurement may be in violation if it falls outside a control limit, violates a predetermined rule, falls outside a specification limit, or the measurement is otherwise deemed unacceptable. Violating measurements may be caused by a faulty fabrication machine or process, among other things. For example, a fabrication machine may include a broken tool or a wore down instrument that is not performing up to par. Identifying the source of the violating measurement can be costly and illusive. For example fabrication downtime, fabricating inadequate products, and/or the overcall cost to identity and remedy the source of a fabrication abnormality may be costly and resource intensive.

Conventionally, SPC violation analysis is performed manually. A user may be presented with SPC charts having identified measurement violations. The user is tasked, through the knowledge of the user, to identify any abnormalities of the fabrication process, including machines, devices, procedures, etc. that may be defective. However, as fabrication systems become more complex and increasingly automated, the ability to measure and take more data advances, the amount of data becomes intractable to process by the user depending only on their own knowledge. Additionally, fabrication systems can be designed to handle many different processes (e.g., various substrate recipes and diverse samples that use a variety of machines, devices, and/or procedures to reach the fabricated result), which require knowledge and memory beyond what can be performed in the human mind. Additionally, determining abnormalities based on SPC results is insufficient to determine upstream faults of machines and/or processes that were used or carried out in association with an operation of the fabrication process prior to the current or final operation of the fabrication process. For example, a first machine may be the source of the abnormality, but a process may use 20 machines, after which the source of the error may be masked or diluted making it difficult to identify the source.

Aspects and implementations of the present disclosure address these and other shortcoming of existing technology by identifying an instance of abnormality (e.g., a faulty machine, defective operation, worn out tool, etc.) of a fabrication process using measurement data of a sample associated with the fabrication process. Initially, a processing device may receive current metrology data for an operation on a current sample in a fabrication process. The metrology data may include a current value for a parameter at each of one or more locations on the current sample. The processing device may obtain a reference rate of change of the parameter value of the parameter for each of the one or more locations. The current rate of change of the parameter value may be associated with the current sample. The processing device may further include comparing the current rate of change of the parameter value to the reference rate of change of the parameter value and identifying an instance of abnormality of the fabrication process based on the comparison.

Aspects of the present disclosure result in technological advantages of significant reduction in energy consumption (e.g., battery or power consumption), bandwidth, latency, and so forth. For example, by processing and analyzing metrology data in the disclosed manner, data can be processed quicker than conventional systems and allow for more efficient data storage and acquisition than conventional systems. Additionally, recommended corrective action to be taken to remedy abnormalities can be identified and applied sooner than in conventional systems, which can result in reduced costs from fabricating defective or malfunctioning samples prior to being corrected, preventing further damage from worn, broken, or otherwise defective equipment, and predicting abnormalities, defects, faults, and/or errors that may occur in the near future and proactively taking corrective action.

FIG. 1 is a block diagram illustrating a manufacturing system 100, according to aspects of the present disclosure. As shown in FIG. 1, manufacturing system 100 includes a manufacturing execution system 102, a metrology system 110, a statistical process control (SPC) system 116, a data store 122, a client device 128, and an equipment engineering system 130. The manufacturing execution system 102, the metrology system 110, the SPC system 116, the data store 122, and/or the equipment engineering system 130 can each be hosted by one or more computing devices including server computers, desktop computers, laptop computers, tablet computers, notebook computers, personal digital assistants (PDAs), mobile communications devices, cell phones, smart phones, hand-held computers, or similar computing devices.

The manufacturing execution system 102, the metrology system 110, the SPC system 116, the data store 122, the equipment engineering system 130, and the client device 128 may be coupled to each other via a network 140 for identifying instances of abnormality in manufacturing execution system 102. In some embodiments, network 140 is a public network that provides each element of manufacturing system 100 with access to each other and other publically available computing devices. In some embodiments, network 140 is a private network that provides each element of manufacturing system 100 with access to each other and other privately available computing devices. Network 140 may include one or more wide area networks (WANs), local area networks (LANs), wired network (e.g., Ethernet network), wireless networks (e.g., an 802.11 network or a Wi-Fi network), cellular network (e.g., a Long Term Evolution (LTE) network), routers, hubs, switches, server computers, and/or combination thereof. Alternatively or additionally, any of the elements of the manufacturing system 100 may be integrated together or otherwise coupled without the use of network 140.

The client device 128 may be or include any personal computers (PCs), laptops, mobile phones, tablet computers, netbook computers, network connected televisions ("smart TV"), network-connected media players (e.g., Blu-ray player), a set-top-box, over-the-top (OOT) streaming devices, operator boxes, etc. The client device 128 may include a browser, an application, and/or a measurement violation tool. In some embodiments, the client device 128 may be capable of accessing the manufacturing execution system 102, the metrology system 110, the SPC system 116, the data store 122, and/or the equipment engineering system 130 (e.g., through network 140 using the browser or application) and communicating (e.g. transmitting and/or receiving) indications of violating measurements, identified abnormalities, and metrology data at various stages of the violation analysis, as described herein.

Manufacturing execution system 102 may include machine operations 104, process implementations 106, and process dependencies 108 for various fabrication processes. A fabrication process may include various steps or operations that utilize one or more machines to perform one or more machine operations 104 using one or more different process implementations 106. For example, various machines may include specialized chambers such as etch chambers, deposition chambers (including chambers for atomic layer deposition, chemical vapor deposition, or plasma enhanced versions thereof), anneal chambers, and/or the like. In another example, machines may incorporate sample transportation systems (e.g., a selective compliance assembly robot arm (SCARA) robot, transfer chambers, front opening pods (FOUPs), side storage pod (SSP), and/or the like) to transport a sample between machines and process steps.

Process implementations 106 may include various specifications for performing a machine operation 104 in a fabrication process. For example, a process implementation 106 may include process specifications such as duration of the machine operation 104, the machine tool used for the operation, the temperature, flow, pressure, etc. of a machine (e.g., a chamber), order of deposition, and the like. In another example, process implementations may include transferring instructions for transporting a sample to a further process step or to be measured by metrology system 110.

Process dependencies 108, also referred to as fabrication recipes or fabrication process instructions, include an ordering of machine operations 104 with process implementations 106 that when applied in a designated order create a fabricated sample (e.g., a substrate or wafer having predetermined properties or meeting predetermined specifications). In some embodiments, the process dependencies 108 of a fabrication process are stored in a data store or, alternatively or additionally, stored in a manner to generate a table of data indicative of the steps or operations of the fabrication process. For example, one or more of the metrology system 110, SPC system 116, and/or equipment engineering system 130 may request a process dependency for a sample currently being measured or for whom associated metrology data is being processed. In a further example, a process dependency can be requested for a specified number of steps (e.g., the last 5, 10, 15, or n process steps of a fabrication process) prior to an operation on a current sample in a fabrication process.

In some embodiments, the manufacturing execution system 102 includes all the instructions, machinery, and processes to fabricate a sample (e.g., a substrate or waver), in other embodiments, the manufacturing execution system 102 controls and coordinates various machines, tools, and processes in fabricating a sample. In other embodiments, the manufacturing execution system 102 combined with the metrology system 110 may form one system that is designed to alternate between manufacturing processes and metrology processes throughout a fabrication process.

Metrology system 110 includes metrology tools 114 for measuring parameters at various locations on samples being fabricated by the manufacturing execution system 102. The parameters may include various measured values indicative of a quality of an operation performed by a fabrication process by the manufacturing execution system 102. For example, a parameter may include thickness, etch rate, resistivity, particle count, etc. of a sample. In some embodiments, the metrology tools coordinate measurements to be taken at specific predetermined locations on each sample. For example, after a specific fabrication operation (e.g., a deposition or etch operation), each sample is taken to the metrology system 110. The metrology tools 114 measure one or more parameters at the same locations for each sample. The metrology system 110 may transfer the data to the SPC system 116 to make a historical record of the measurements associated with a specific operation of a fabrication process. The historical sample data 124 may be used by the metrology system 110 and/or the SPC system 116 to create a record of parameter measurements over a range of samples all being process after the same operation of the fabrication process.

In some embodiments, the samples fabricated with the manufacturing execution system 102 are measured by the metrology system 110 after every step of a fabrication recipe. In some embodiments, the process dependencies 108 or fabrication recipes may include measurement steps such that every sample is fabricated with the same process dependencies 108 and every sample is measured under the same conditions following the same operations.

As shown in FIG. 1, statistical process control (SPC) system 116 may include statistical process tools 118 and an SPC data store such as an SPC database 120. The SPC system 116 receives metrology data from metrology system 110 and/or equipment engineering system 130. The SPC system may receive context data (e.g., channel ID, equipment ID, product, process name process step number lot ID, etc.) from manufacturing execution system 102, metrology system 110, data store 122, and/or equipment engineering system 130. The SPC system 116 applies the metrology data to appropriate charts (e.g., thickness, etch rate, resistivity, particle count, etc), analyzes the metrology data to detect violations (e.g., product characteristics that are above or below predefined thresholds), generates information about a product having a detected violation (e.g., a lot ID, a wafer ID, a recipe name), and provides this information to the equipment engineering system 130. In addition, the SPC system 116 presents SPC charts to SPC clients, such as client device 128. For example the SPC charts may be presented in client applications and/or web-based browser applications hosted by client device 128 such as a personal computer, laptop, mobile phone, etc.

The SPC database 120 includes historical metrology data. For example, historical metrology data may include past SPC charts (e.g., thickness, etch rate, resistivity, particle count, etc.) and measurement violation data. The SPC database 120 may calculate a reference rate of parameter change 121 of historical sample data 124. For example an analysis of variance (ANOVA) may be calculated for one or more historical rates of change of samples measured by metrology system 110 after being fabricated by manufacturing execution system 102. In some embodiments, the SPC system 116 stores the reference rates of change 121 of the parameter value and historical sample data, and in other embodiments, the SPC system 116 stores the rate of change of the parameter value and historical sample data in data store 122.

Data store 122 may be a memory (e.g., random access memory), a drive (e.g., a hard drive, a flash drive), a database system, or another type of component or device capable of storing data. Data store 122 may store one or more of historical sample data 124 and failure mode and effects analysis (FMEA) data 126. The historical sample data 124 may include parameter values for various parameters measured from a sample fabricated during various fabrication processes (e.g., fabrication process 200 of FIG. 2). The historical sample data 124 may include reference rates of change of the parameter value for each parameter at each location on one or more previous samples, previously fabricated during a fabrication process. The FMEA data 126 may store data associated with the failure mode and effects analysis tool 138 and process failure mode and effects analysis more generally (see e.g., process failure mode and effects analysis 500 of FIG. 5).

The equipment engineering system 130 may include a measurement violation tool 132. The measurement violation tool includes a process dependency tool 134, a rate of change tool 135, a pattern mapping tool 137, and a failure mode and effects analysis (FMEA) tool 138. The equipment engineering system 130 receives metrology data from the metrology system 110 and/or the manufacturing execution system 102 and sends the metrology data to the SPC system 116. The equipment engineering system 130 receives SPC data associated with the machine, tool, and/or process operations of the fabrication process associated with the metrology data.

The process dependency tool 134 requests process dependency 108 data, from the manufacturing execution system 102 and/or the data store 122, associated with the metrology data taken by metrology tools 114. The process dependency tool 134 matches prior machine operations 104 and process implementations 106 to measurements of a current sample.

The rate of change tool 135 calculates a current rate of change of a current sample being measured by metrology system 110. The current rate of change may include a determination of a current parameter value rate of change. For example, a parameter is measured by metrology system 110 and a set of parameter values are obtained at various locations across a sample. These parameter values are compared against historical parameter values to determine how much the current parameter values have changed. In some embodiments, the rate of change of the parameter value is calculated by comparing the current parameter values to a sample that was fabricated immediately previous to the current sample. The difference between the current parameter values and parameter values taken from the sample fabricated immediately previous to the current sample may yield a rate of change of the parameter value. In other embodiments, multiple historical measurements are used with various rate of change of the parameter value calculation techniques. For example, the rate of change may be calculated by using one of a moving average, a mean statistic, a long term statistic, a short term statistic, derivatives, integrals, and/or and a known rate of change calculation method.

The rate of change tool 135 compares a reference rate of change of the parameter value (e.g., a historic rate of change of the parameter value) received from the SPC system 116 or calculated locally by the equipment engineering system 130 to a current rate of change of the parameter value of a current sample. In some embodiments, the reference rate of change of the parameter value is determined using one or more historical rates of change of the parameter value from historical metrology data for the operation on one or more previous samples in the fabrication process.

In some embodiments, based on the comparison of a current rate of change of the parameter value and a reference rate of change of the parameter value, the rate of change tool 135 identifies one or more violating locations each having an associated current rate of change of the parameter value that is greater than an associated reference rate of change of the parameter value.

The analysis of variance (ANOVA) tool 136 works with the rate of change tool 135 to identify the one or more violating locations. The ANOVA tool 136 perform an ANOVA with the one or more of the historical rate of change of the parameter values to determine the reference rate of change of the parameter value. In a further embodiment, the ANOVA result may be used to determine a threshold range of acceptable or non-violating rates of change of the parameter value for a parameter at each of the one or more locations for an operation on a current sample in a fabrication process. In some embodiments, the reference rate of change of the parameter value may be a range of non-violating values that are statistically calculated from one or more historical rates of change of the parameter value by the ANOVA tool 136.

The pattern mapping tool 137 receives one or more violating locations from one of the rate of change tool 135 and/or the ANOVA tool 136 and generates a sample pattern associated with the one or more violating locations on the current sample. In some embodiments, the pattern mapping tool 137 applies a scaling (e.g., normalization of data points) for different violating locations based on trends or common patterns recorded on previous samples.

The failure mode and effects analysis (FMEA) tool 138 identifies an instance of abnormality of the fabrication process based on the comparison of the current rate of change of the parameter value and the reference rate of change of the parameter value. In some embodiments, the FMEA tool 138 receives the sample pattern from the pattern mapping tool 137 and identifies the instance of abnormality based on the sample pattern.

The FMEA tool 138 may retrieve FMEA data 126 from data store 122. The FMEA data 126 may include a list of known issues and root causes for the given equipment that has known symptoms associated with each. The pattern sample data received by the FMEA tool 138 is applied to the list of known issues and a report is generated identifying common causes of the violating locations. For example, the FMEA tool 138 may receive a sample pattern and identify a tool, machine, or operation of the fabrication process that is defective.

In some embodiments the FMEA tool 138 can be used with the process dependency tool 134 to identify a tool, machine, or process that is operated upstream (e.g., an operation step that occurred prior to the current manufacturing step of the same fabrication process) from the current machine operation being performed on a current sample. For example, a current sample may have recently undergone a first operation by a first machine. In some embodiments, the combination of the process dependency tool 134 and the FMEA tool 138 can lookup past operations for the sample, such as a second operation by a second machine or tool. The FMEA tool 138 can use the sample pattern to identify that the second machine or second tool is the source of the abnormality.

Once the instance of abnormality is identified, the FMEA tool 138 can proceed by performing one of altering at least one of an operation of a machine or an implementation of a process associated with the instance of abnormality and/or providing a graphical user interface (GUI) presenting a visual indicator of a machine or process associated with the instance of abnormality. The GUI may be sent through network 140 and presented on client device 128. In some embodiments, altering the operation of the machine or the implementation of the process may include sending instructions to the manufacturing execution system 102 to alter machine operations 104 and/or process implementations 106 associated with a process recipe or process dependency 108.

It should be noted that although manufacturing system 100 is depicted and described as a number of different systems and/or device, various devices may be combined together to perform the function of entities that are depicted as separate on FIG. 1. For example manufacturing execution system 102 may be combined with metrology system 110 to carry out a fabrication process through manufacturing and metrology operations. In another example the equipment engineering system 130 may be combined with SPC system 116 to both analyze the data from a SPC analysis and a rate of change analysis using statistical process tool 118 with the rate of change tool 135. In another example, data store 122 may be stored on one or more of manufacturing execution system 102, the metrology system 110, the SPC system 116, the equipment engineering system 130, and/or the client device 128. Additionally, although depicted in FIG. 1 as using network 140 to communicate with each other, any of the manufacturing execution system 102, metrology system 110, SPC system 116, data store 122, client device 128, and/or equipment engineering system 130 may be coupled directly and communicate between each other without requiring network 140.

Figure 2:
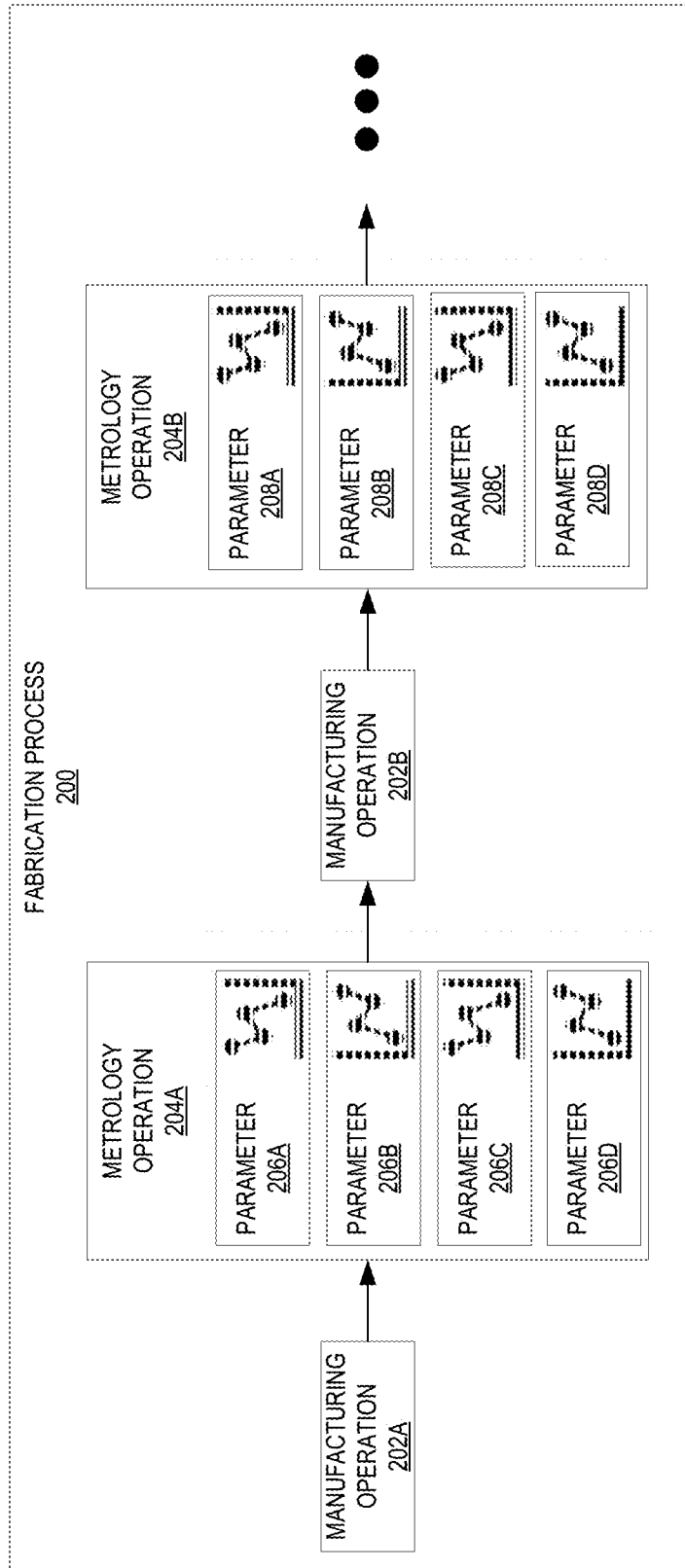
FIG. 2 is a block diagram illustrating a fabrication process of a manufacturing system, according to aspects of the present disclosure.

FIG. 2 is a block diagram illustrating a fabrication process 200 of a manufacturing system (e.g., manufacturing system 100 of FIG. 1), according to aspects of the present disclosure. The fabrication process 200 may include one or more manufacturing operations 202A-B and one or more metrology operations 204A-B. The manufacturing operations 202A-B may be performed by a manufacturing execution system (e.g., manufacturing execution system 102 of FIG. 1). The metrology operations 204A-B may be performed by a metrology system (e.g., metrology system 110 of FIG. 1).

In some embodiments, the fabrication process 200 may include a series of manufacturing operations 202A-B and metrology operations 204A-B that when completed create a fabricated sample with predetermined characteristics and/or specifications. For example, a fabrication process to manufacture a multi-layered substrate may include various layer deposition operations that each deposit a layer onto the substrate. The manufacturing operations 202A-B may be designed to be completed in a predetermined order to create a multi-layered substrate with the correct order of layers.

Manufacturing operations 202A-B may include various methods of fabricating a sample. For example, manufacturing operations may include etching (e.g., dry etching, plasma etching, wet etching, chemical etching, etc.), deposition (e.g., atomic layer deposition (ALD), chemical vapor deposition (CVD), or plasma enhanced versions thereof), patterning (e.g., photolithography, masking, etc.), microforming, and/or the like.

Metrology operations 204A-B may include various methods and techniques for measuring a set of parameters 206A-D, 208A-D across one or more locations on a fabricated sample at various stages of the fabrication process 200. The set of parameters 206A-D, 208A-D may include various measured values associated with manufacturing operations 202A-B. For example, the set of parameters 206A-D, 208A-D may include measuring a thickness of a channel, thickness of a layer or region, etch rate, resistivity, particle count, etc. of a sample. The measured values of the parameter may be indicative of a quality level of the performed manufacturing operation. In some embodiments, the fabrication process 200 measures 25-50 parameters across 12-20 locations across each sample.

In some embodiments, the parameters measured during a metrology operation 204A-B are indicative of a quality of the previous manufacturing operation. Alternatively, the parameters measured during a metrology operation 204A-B may be indicative of a quality of the one or more of the previous manufacturing operations. For example, manufacturing operations 202A and 202B may both be layer deposition operations and a parameter (e.g., 208A) may measure the thickness of a substrate. The thickness of the substrate during metrology operation 204B may be affected by manufacturing operation 202A and 202B. The relationships between parameters and operations may be stored as part of a fabrication process recipe or process dependency (e.g., process dependencies 108 of FIG. 1). The process dependencies may track and manage the effects of manufacturing operations 202A-B and downstream processes (e.g., machine operations and process implementation that will be performed in the future of the same fabrication process as the current machine operation or process implementation), or processes that will occur after a specified manufacturing operation. Additionally, when a parameter value is processed or analyzed, process dependency data can provide a link between prior operations and a current quality of manufacture of a fabrication sample at a specified stage of the fabrication process 200.

In some embodiments, manufacturing operations 202A-B and metrology operations 204A-B alternate throughout the fabrication process. It should be noted that in some embodiments multiple manufacturing operations 202A-B may be performed between metrology operations 204A-B. Likewise, various metrology operations may be performed between manufacturing operations 202A-B. The procedure and cadence of the manufacturing operations 202A-B and metrology operations 204A-B may be dependent on the specific fabrication process 200.

Figure 3:
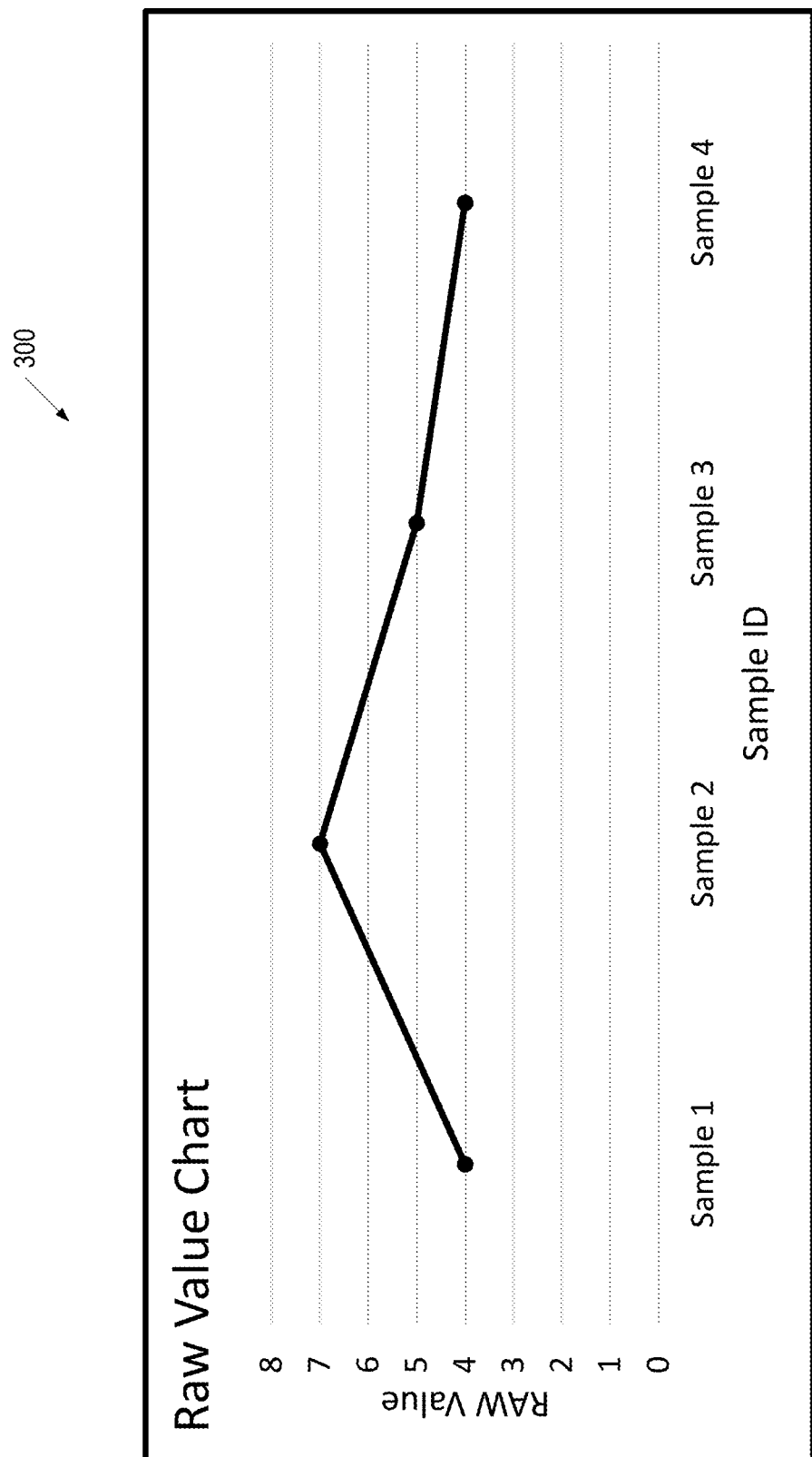
FIG. 3 illustrates a rate of change of the parameter value distribution of various sample for an operation in a fabrication process, according to aspects of the present disclosure.

FIG. 3 illustrates a rate of parameter change distribution 300 of various samples for an operation in a fabrication process, according to aspects of the present disclosure. As noted regarding FIG. 2, a fabrication process (e.g., fabrication process 200 of FIG. 2) may include various manufacturing operations (e.g., manufacturing operations 202A-B of FIG. 2) and various metrology operations (e.g., metrology operations 204A-B of FIG. 2) associated with the various manufacturing operations. A fabrication process may be used to generate multiple samples. As a result, values for a given parameter (e.g., parameters 206A-D, 208A-D of FIG. 2) at each of one or more location across a set of sample is measured.

As shown in FIG. 3, a parameter is measured at a designated location on a set of samples (e.g., sample 1, sample 2, sample 3, and sample 4) for an operation in a fabrication process. A rate of change tool (e.g., rate of change tool 135 of FIG. 1) may be used to process the raw metrology data to determine a current rate of change of the parameter value and a reference or historical rate of change of the parameter value.

A current rate of change of the parameter value can be calculated using a current measurement of a current sample and a previous measurement of a sample fabricated immediately previous to the current sample. In some embodiments, sample 1 may be fabricated prior to sample 2, sample 2 may be fabricated prior to sample 3, sample 3 may be fabricated prior sample 4, and sample 4 may be a current sample. A current sample rate of change may include calculating a difference between a current sample and the sample immediately previous (e.g., sample 4 and sample 3, respectively). This current rate of change of the parameter value can be calculated for each subsequent location on a sample. Further, the current rate of change of the parameter value can be calculated for all the parameters.

A reference rate of change of the parameter value can be calculated using historical metrology data (e.g., historical sample data 124). For example, previous samples (e.g., sample 1, sample 2, and/or sample 3) may be used to calculate a historical rate of change of the parameter value for a parameter at a particular location on the samples. For example, the rate of change of the parameter value may be calculated using one of a moving average, a mean statistic, a long term statistic, a short term statistic, derivatives, integrals, and/or a known rate of change calculation method.

The current rate of change of the parameter value is compared to the reference rate of change of the parameter value. In one embodiment, the comparison is performed by applying a statistical distribution to the reference rate of change of the parameter value to identify a variance between the current rate of change of the parameter value and the reference rate of change of the parameter value. For example, a mean and a standard deviation is calculated from the historical rates of parameter values change and are compared against the current rate of change of the parameter value to identify how many standard deviations the current rate of change of the parameter value is from the mean of the one or more historical rates of change of a parameter value.

In some embodiments, a predetermined control limit or threshold limit (e.g., one standard deviation, two standard deviations, three standard deviations, etc.) is used to identify locations that have abnormal current rates of change of a parameter value. It should be noted that the control limit identified herein may be different that a conventional SPC control limit. SPC controls identify a threshold range of measured values, while the control limits identified herein identify a threshold range of a rate of change of the parameter value instead of an evaluation of a static measurement of sample. This difference may result in identifying violating locations that otherwise might not be flagged in a conventional SPC analysis.

In some embodiments, the reference rate of change of the parameter value may be calculated using a defined sampling window. For example, the reference rate of change of the parameter value may be generated by the n number of samples generated prior to a current sample. For example, a reference rate of change of the parameter value may be limited to sample fabricated within an amount of time (e.g., last 24 hours, week, month, etc.) or amount of samples (e.g., the last 10, 100, 1000, etc. samples fabricated). It should also be noted that a reference rate of change of the parameter value is calculated at each location or site on a sample. The current rate of change of the parameter value is compared on a location by location comparison across the surface of the sample.

In some embodiments, the violating locations on a sample may be indicated by a scoring system or by placing each location into a tier or degree of violation rather than a binary indication of a violating measurement. For example, a location may be classified into tiers such as "passing", "level one violation", "level two violation", "level three violation", etc. The violation tiers may correspond to the variance of the current rate of change of the parameter value from the reference rate of change of the parameter value, at each location. For example, a location that is less than one standard deviation off may be labeled as "passing," a location that is between one and two standard deviations may be labeled as a "level-one violation," a location that is between two and three standard deviations may be labeled as a "level-two violation," and so forth. Each violation may be assigned a weight or a score than may be used to further establish a sample pattern, as described in reference to FIG. 4.

In some embodiments, a rate of change of the parameter value is calculated for every sample transition. For example, referring to FIG. 3, a rate of change may be calculated from sample 1 to sample 2, from sample 2 to sample 3, and from sample 3 to sample 4 to form a historical rate of change of the parameter value dataset.

In some embodiments, a first analysis of variance (ANOVA) is calculated on each process step, parameter, and location to identify variation within and across the samples in a particular process step and parameter to compare data wafer-to-wafer. In some embodiments, a second ANOVA is calculated within and across the locations of a particular process step and parameter to compare locations within a wafer. In some embodiments, a third ANOVA is calculated within and across the entire historical rate of change of the parameter value dataset (e.g., a combination of the first ANOVA and the second ANOVA). The first ANOVA, the second ANOVA, and/or the third ANOVA may then be used to generate a sample pattern for a current sample as well as previous historical samples for a given parameter and process step of a fabrication process.

Figure 4:
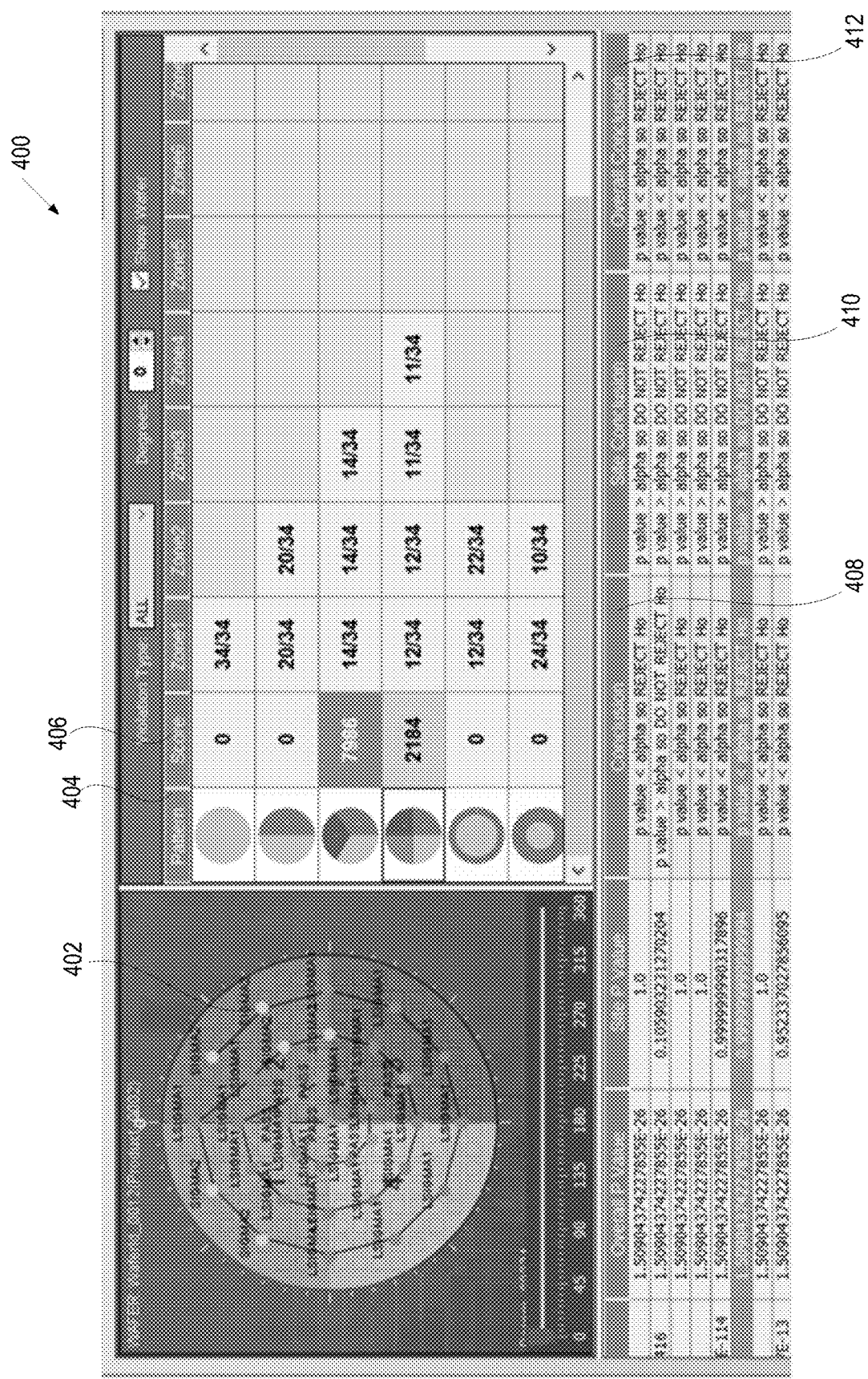
FIG. 4 illustrates an exemplary graphical user interface for a sample pattern, according to aspects of the present disclosure.

FIG. 4 illustrates an exemplary graphical user interface (GUI) 400 for a sample pattern 404, according to aspects of the present disclosure. The GUI 400 identifies one or more locations 402 on a sample, one or more sample patterns 404, a score 406 associated with each pattern, a conclusion 408, a site conclusion 410, and an overall conclusion 412.

The one or more locations 402 may include a first subset of locations identified as being in violation and a second subset of locations identified as passing or conforming. In some embodiments, the one or more locations 402 may include a score quantifying the degree to which each location is in violations (e.g., passing, tier 1 violation, tier 2 violation, etc.).

The sample pattern 404 may include various combinations of violations that a sample may experience during a fabrication process. These sample patterns 404 may be based on common violation grouping on a sample. For example, a tool that is malfunctioning may incorrectly process locations on sample in close proximity to each other. In some embodiments, the sample pattern 404 are associated with violation patterns of process functions 502, parameters 504, potential fail modes 506, and potential fail effects 508 of a failure mode and effects analysis (FMEA) as described in association with FIG. 5. For example, identifying a sample pattern 404 may include identifying edge sites or dishing problems in the center of the wafer or quadrature. In another example, a sample pattern 404 may identify a particular location, zone, or behavior that is specific to a process tool, machine, or operation.

As described previously (e.g. in association with ANOVA tool 136 of FIG. 1), in some embodiments, a first analysis of variance (ANOVA) is calculated on each process step, parameter, and location to identify variation within and across the samples in a particular process step and parameter to compare data wafer-to-wafer. In some embodiments, a second ANOVA is calculated within and across the locations of a particular process step and parameter to compare location within a wafer. In some embodiments, a thirst ANOVA is calculated within and across the entire historical rate of change of the parameter value dataset (e.g., a combination of the first ANOVA and the second ANOVA). The first ANOVA, the second ANOVA, and the third ANOVA may then be used to generate a sample pattern for a current sample as well as previous historical samples for a given parameter and process step of a fabrication process.

Conclusion 408 is focused on the variation from wafer to wafer in the current process. Conclusion 408 may include processing data associated with the first ANOVA. For example, the first ANOVA may identify variation within and across sample in a particular process step with an designated parameter. Conclusions 408 may be provided based on processing logic comparing a current wafer against previous wafers and analyzing a single parameter to determine if a pattern exists having common parameters failing across different wavers.

Site conclusion 410 is focused on the variation that exits within the sample set on the current process. Site conclusions 410 may be provided by processing data associated with the second ANOVA. For example, the second ANOVA may identify a particular site and determine how various parameters and samples performed at the particular site. Site conclusions 410 may be provided based on processing logic comparing data associated with a particular site from a current sample and historical samples to determine if a pattern exists where the values of various parameters and various samples are failing at a particular location on each of the samples.

Overall conclusion is focused on identifying inherited variation coming from upstream processes that may be impacting the results of the current process. Overall conclusions 412 may be provided by processing data associated with the third ANOVA. For example, the third ANOVA may identify patterns across the entire data set, including process dependencies for multiple locations across various samples. For example, overall conclusions 412 may be based on processing logic comparing historical metrology data (e.g. reference rates of parameter change) with metrology data (e.g. current rates of parameter change) at various locations and with various parameter to determine if a pattern exists between historical or inherited violations measurements from upstream measurements or of the historical metrology data and current violations measurements of the current metrology data from data associated with the third ANOVA.

Figure 5:
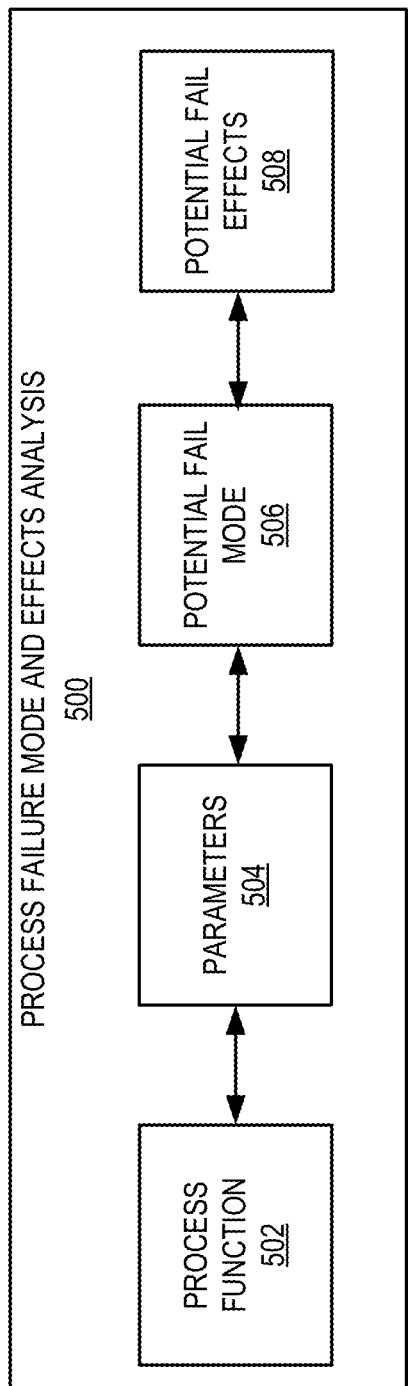
FIG. 5 is a block diagram illustrating a process failure mode and effects analysis (FMEA), according to aspects of the present disclosure.

FIG. 5 is a block diagram illustrating a process failure mode and effects analysis (FMEA) 500, according to aspects of the present disclosure. The process FMEA includes process functions 502, parameters 504, potential fail modes 506, and potential fail effects 508. The process FMEA may be performed using a process FMEA tool (e.g., failure mode and effects analysis tool 138 of FIG. 1). The process FMEA receives process functions 502 from one of a manufacturing system, a metrology system, and/or SPC system. The process function 502 may be organized into process dependencies. For example, the process function 502 may be stored in a dependency table, where the dependency identifies parameters and locations on a sample affected by specific process functions 502. For example, the process function 502 may define the machine operations (e.g., lithography, etching, deposition, etc.).

The process FMEA receives data associated with parameters 504. In some embodiments, the parameter data may be received as a sample pattern, as described in reference to FIG. 4. Alternatively, the parameter data may be received as a list of violating locations and parameters that are in violation of a predetermined threshold range. The parameter data may identify locations having violating measurements. Violating measurements may include data that fails to meet a predetermined threshold such as the rate of change of the parameter value of a measurement that is beyond an acceptable reference rate of change of the parameter value for a given parameter at a specific location (as described in reference to FIG. 2).

The process FMEA 500 includes potential fail modes 506 and potential fail effects 508 of a manufacturing system (e.g., manufacturing system 100 of FIG. 1). For example, the FMEA table includes a list of known issues and root causes for a given machine, tool, and/or piece of equipment as well as the symptoms associated with each issue and root cause. The process FMEA 500 may include logic linking the process functions 502 and/or parameters 504 to potential fail modes 506 and/or potential fail effects 508. The process FMEA 500 may receive processed metrology data and identify an instance of abnormality of the manufacturing system. For example, metrology data may be processed using other embodiments described herein and received by the process FMEA tool. The process FMEA tool may analyze the data and identify one or more defective machines, tools, and/or pieces of equipment as well as the effects the defective tool has on the fabricated samples. For example, the process FMEA may identify a deposition tool as being broken, faulty, or in otherwise need of repair or replacement as well as describe the effects the current state of the deposition tool has on performing its function (uneven layers, overly thin or thick layers, etc.) across the different locations on the sample.

In some embodiments, the process FMEA 500 may generate instructions for an equipment engineering system (e.g., equipment engineering system 130 of FIG. 1) to alter one of an operation of a machine or an implementation of a process associated with an instance of abnormality identified by the process FMEA 500 for a fabrication process.

In some embodiments, the process FMEA 500 may generate instructions for an equipment engineering system (e.g., equipment engineering system 130 of FIG. 1) to provide a graphical user interface (GUI) to present a visual indicator of a machine or a process associated with the instance of abnormality. For example, the visual indicator may be sent to a client device (e.g., client device 128 of FIG. 1) for an engineer or operator of the fabrication process to manually alter a manufacturing execution system carrying out the fabrication process.

In some embodiments, machine learning (ML) algorithms that generate one or more trained machine learning models, deep ML algorithms, and/or other signal processing algorithms for analyzing parameter data can be used to determine potential fail modes 506 and potential fail effects 508 of a manufacturing system. These models, analysis, and/or algorithms can be used to calculate, predict, and evaluate combinations of process functions 502 and parameters 504 to predict and identify potential fail modes 506 and potential fail effects 508. In some embodiments, training data to train a ML model may be obtained by a metrology system (e.g., metrology system 110 of FIG. 1) or historical sample data (e.g., historical sample data 124 of FIG. 1).

One type of machine learning model that may be used is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In process abnormality application, for example, the raw input may be current and historical metrology data; the first representational layer may abstract the location and parameter values; the second layer may compose and encode basic violating locations; the third layer may encode sample patterns; and the fourth layer may recognize and match the data to potential fail modes and potential fail effects of a fabrication process. Notably, a deep learning process can learn which features to optimally place in which level on its own. The "deep" in "deep learning" refers to the number of layers through which the data is transformed. More precisely, deep learning systems have a substantial Credit Assignment Path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, a neural network is trained using a training dataset that includes multiple data points, where each data point includes parameter 504, a location on the sample, and a process function 502. Each training data point may additionally include or be associated with a potential fail mode 506 and/or a potential fail effect 508. The neural network may be trained using the training dataset to receive an input of a process function, location on a sample, and parameter and to output an identification of an instance of abnormality of a manufacturing system. Alternatively or additionally, the neural network may incorporate use of a sample pattern as either input or output of the training dataset as described in reference to FIG. 4.

Figure 6:
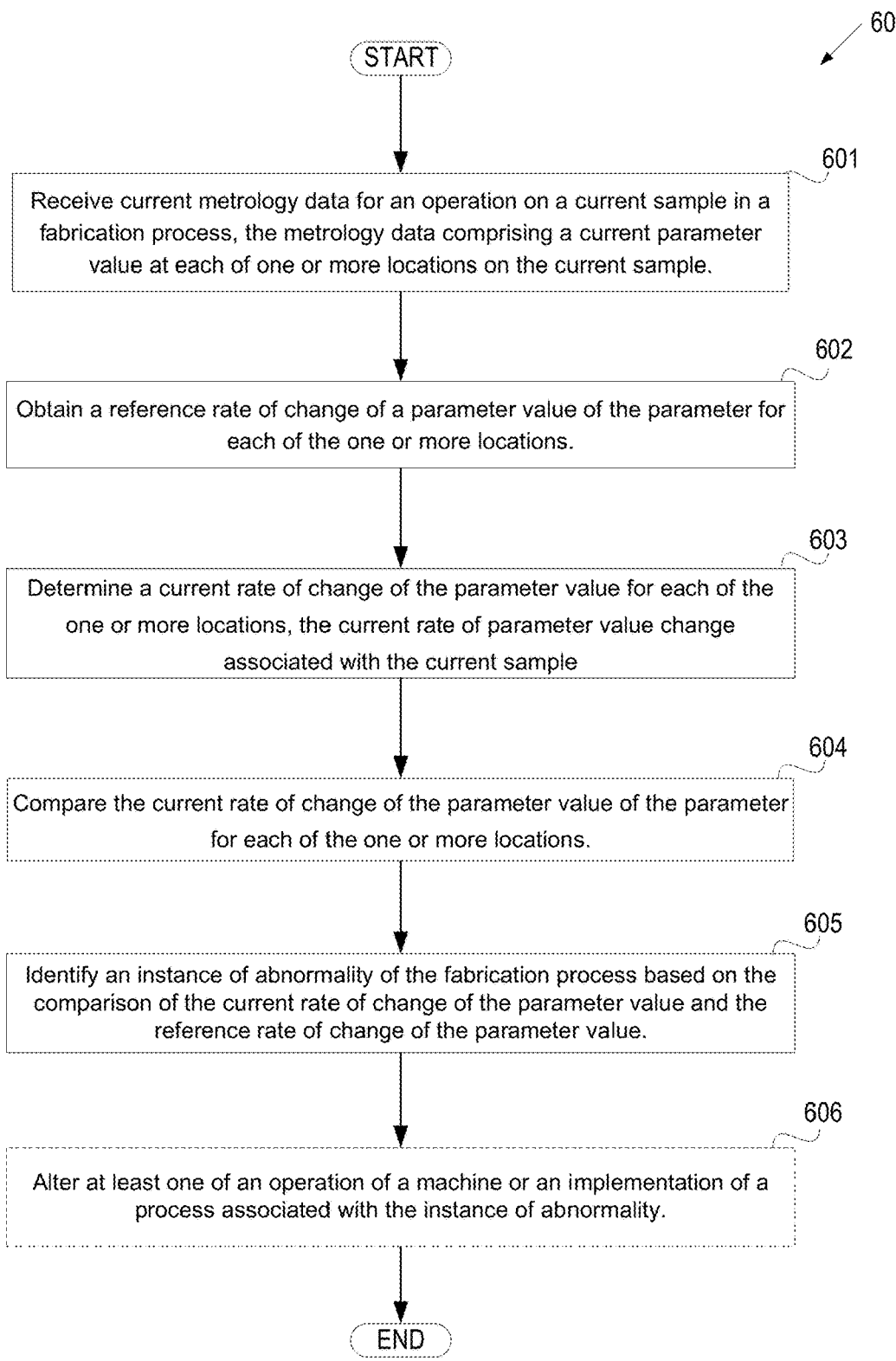
FIG. 6 is a flow diagram of a method for identifying an instance of abnormality of a fabrication process, according to aspects of the present disclosure.

FIG. 6 is a flow diagram of a method 600 for identifying an instance of abnormality of a fabrication process, according to aspects of the present disclosure. For simplicity of explanation, method 600 is depicted and described as a series of acts. However, acts in accordance with this disclosure can occur in various orders and/or concurrently with other acts not presented and described herein. Furthermore, not all illustrated acts may be performed to implement method 600 in accordance with the disclosed subject matter. In addition, those skilled in the art will understand and appreciate that method 600 could alternatively be represented as a series of interrelated states via a state diagram or events.

Referring to FIG. 6, at block 601 the processing logic receives current metrology data for an operation on a current sample in a fabrication process. The metrology data may include a parameter value at each of one or more locations on the current sample. The current metrology data may be received from a metrology system (e.g., metrology system 110 of FIG. 1), a manufacturing execution system (manufacturing system 102 of FIG. 1), or an SPC system (e.g., SPC system 116 of FIG. 1). The metrology data may be associated with a machine operation (e.g., machine operation 104 of FIG. 1) and/or a process implementation (e.g., process implementation 106 of FIG. 1) of a fabrication process (e.g., fabrication process 200 of FIG. 2).

At block 602, the processing logic obtains a reference rate of change of the parameter value of a parameter for each of the one or more locations. In some embodiments, the reference rate of change of the parameter value is determined using one or more historical rates of change of a parameter value from historical metrology data for the operation on one or more previous samples in the fabrication process. Alternatively or additionally, the reference rate of change may be obtained through any of the disclosed embodiments disclosed herein (e.g., calculating the reference rate of change of the parameter value as described in reference to FIGS. 1 and 3). In some embodiments, the reference rate of change is calculated by an SPC system (e.g, SPC system 116 of FIG. 1) or a rate of change tool (e.g., rate of change tool 135 of FIG. 1).

At block 603, the processing logic determines a current rate of change of the parameter value for each of the one or more locations. The current rate of change of the parameter value may be associated with the current sample. Determining the current rate of change of the parameter value associated with the current sample may include any or all of the disclosed statistical and data processing techniques disclosed herein (e.g., the statistical and data process techniques disclosed in association with FIG. 3).

At block 604, the processing logic compares the current rate of change of the parameter value for each of the one or more locations. In some embodiments, the processing logic may further identify one or more violating locations each having an associated current rate of change of the parameter value that is greater than an associated reference rate of change of the parameter value. Identifying violating measurement may include any or all of the disclosed statistical and data processing techniques disclosed herein (e.g., the statistical and data process techniques disclosed in reference to FIG. 3).

At block 605, the processing logic identifies an instance of abnormality of the fabrication process based on the comparison of the current rate of change of the parameter value and the reference rate of change of the parameter value. In some embodiments, the process may further retrieve one or more process dependencies of the fabrication process and identify the instance of abnormality of the fabrication process based on one or more of the process dependencies. The instance of abnormality may include a defective machine, tool, or piece of equipment or an improperly implemented process operation. Identifying the instance of abnormality may include identifying the source (e.g., machine, tool, equipment, process, etc.) of the abnormality or the effects of the abnormality (e.g., damaged samples, potential damage to other machines, parameters that are likely not to meet specification requirements).

At block 606, optionally, the processing logic alters at least one of an operation of a machine or an implementation of a process associated with the instance of abnormality. Altering the operation of a machine or implementation of a process may involve shutting down a machine, halting a process, or indicating an error and awaiting a user input to stop or adjust a mode of operation prior to resuming operation.

In some embodiments, the processing logic may provide a graphical user interface (GUI) presenting a visual indicator of a machine or a process associated with the instance of abnormality. For example, a measurement violation tool (e.g., measurement violation tool 132 of FIG. 1) may identify an instance of abnormality (e.g., a defective machine, tool, process implementation) and prepare for presentation on a client device (e.g. client device 128 of FIG. 1), a visual indicator of the instance of abnormality. A user (e.g., engineer or manufacturing system operator) may use the indicator to direct remedial action to correct for the abnormality.

In some embodiments, the processing logic may further identify one or more violating locations each having an associated current rate of change of the parameter value that is greater than an associated reference rate of change of the parameter value. In a further embodiment, the processing logic may further determine a sample pattern associated with the one or more violating locations and identify the instance of abnormality based on the sample pattern.

Figure 7:
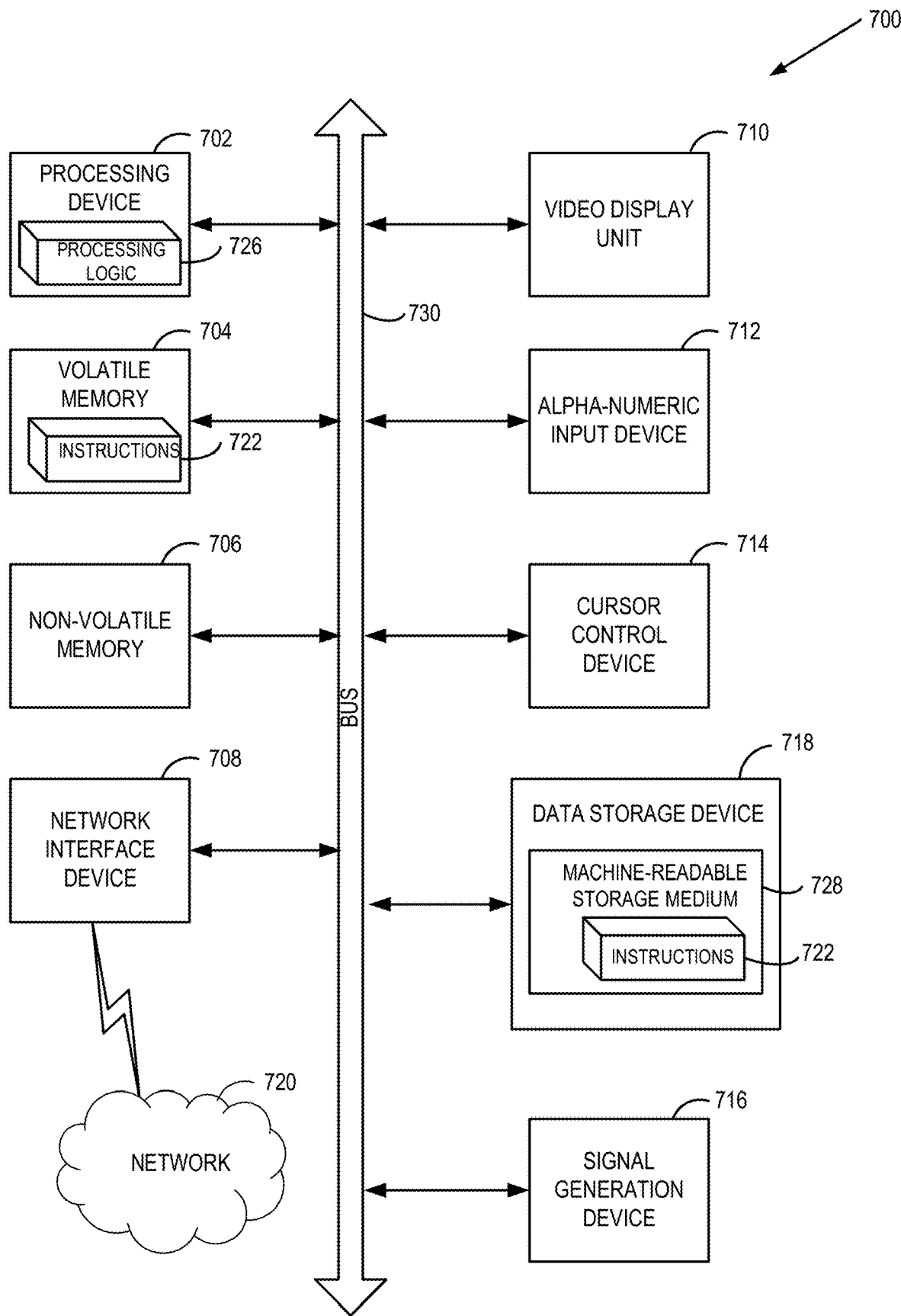
FIG. 7 illustrates a block diagram of an example computing device capable of identifying instances of abnormality of a fabrication process.

FIG. 7 illustrates a block diagram of an example computing device 700 capable of identifying instances of abnormality of a fabrication process. In various illustrative examples, various components of the computing device 700 may represent various components of the manufacturing execution system 102, metrology system 110, SPC system 116, data store 122, client device 128, equipment engineering system 130 and network 140 illustrated in FIG. 1.

Example computing device 700 may be connected to other computer devices in a LAN, an intranet, an extranet, and/or the Internet. Computing device 700 may operate in the capacity of a server in a client-server network environment. Computing device 700 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 700 may include a processing device 702 (also referred to as a processor or CPU), a main memory 704 (e.g., read-only memory (ROM), flash memory, dynamic random access memory (DRAM) such as synchronous DRAM (SDRAM), etc.), a static memory 706 (e.g., flash memory, static random access memory (SRAM), etc.), and a secondary memory (e.g., a data storage device 718), which may communicate with each other via a bus 730.

Processing device 702 represents one or more general-purpose processing devices such as a microprocessor, central processing unit, or the like. More particularly, processing device 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 702 may be configured to execute instructions implementing method 600 illustrated in FIG. 6.

Example computing device 700 may further comprise a network interface device 708, which may be communicatively coupled to a network 720. Example computing device 700 may further comprise a video display 710 (e.g., a liquid crystal display (LCD), a touch screen, or a cathode ray tube (CRT)), an alphanumeric input device 712 (e.g., a keyboard), a cursor control device 714 (e.g., a mouse), and an acoustic signal generation device 716 (e.g., a speaker).

Data storage device 718 may include a machine-readable storage medium (or, more specifically, a non-transitory machine-readable storage medium) 728 on which is stored one or more sets of executable instructions 722. In accordance with one or more aspects of the present disclosure, executable instructions 722 may comprise executable instructions associated with executing method 600 illustrated in FIG. 6.

Executable instructions 722 may also reside, completely or at least partially, within main memory 704 and/or within processing device 702 during execution thereof by example computing device 700, main memory 704 and processing device 702 also constituting computer-readable storage media. Executable instructions 722 may further be transmitted or received over a network via network interface device 708.

While the computer-readable storage medium 728 is shown in FIG. 7 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method, comprising:
   receiving, by at least one processing device, current metrology data for an operation on a current sample in a fabrication process, the current metrology data comprising a current value for a parameter at each of one or more locations on the current sample;
   determining, by the at least one processing device, a current rate of change of the parameter value for each of the one or more locations, the current rate of change of the parameter value associated with the current sample;
   identifying, by the at least one processing device, one or more violating locations each having an associated current rate of change of the parameter value that is greater than an associated reference rate of change of the parameter value, wherein the associated reference rate of change is associated with one or more historical rates of change of the parameter value;
   identifying, by the at least one processing device, an instance of abnormality of the fabrication process based on the one or more violating locations; and
   causing performance of a corrective action associated with fabrication process equipment based on the instance of abnormality.

2. The method of claim 1, further comprising:
   altering, by the at least one processing device, at least one of an operation of a machine or an implementation of a process associated with the instance of abnormality.

3. The method of claim 1, wherein at least one of the associated reference rate of change of the parameter value is determined by performing an analysis of variance (ANOVA) with the one or more historical rates of change of the parameter value.

4. The method of claim 1, further comprising:
   determining, by the at least one processing device, a sample pattern associated with the one or more violating locations; and
   identifying, by the at least one processing device, the instance of abnormality based on the sample pattern.

5. The method of claim 1, further comprising:
   retrieving, by the at least one processing device, one or more process dependencies of the fabrication process; and
   identifying, by the at least one processing device, the instance of abnormality of the fabrication process based on one or more of the process dependencies.

6. The method of claim 1, further comprising:
   providing, by the at least one processing device, a graphical user interface (GUI) presenting a visual indicator of a machine or a process associated with the instance of abnormality.

7. The method of claim 1, further comprising:
   obtaining, by the at least one processing device, the associated reference rate of change of the parameter value of the parameter for each of the one or more locations, wherein the associated reference rate of change of the parameter value is determined using one or more historical rates of change of the parameter value from historical metrology data for the operation on one or more previous samples in the fabrication process.

8. A system comprising:
   a memory; and
   at least one processing device, coupled to the memory, to perform operations comprising:
   receiving current metrology data for an operation on a current sample in a fabrication process, the current metrology data comprising a current value for a parameter at each of one or more locations on the current sample;
   determining a current rate of change of the parameter value for each of the one or more locations, the current rate of change of the parameter value associated with the current sample;
   identifying one or more violating locations each having an associated current rate of change of the parameter value that is greater than an associated reference rate of change of the parameter value, wherein the associated reference rate of change is associated with one or more historical rates of change of the parameter value;
   identifying an instance of abnormality of the fabrication process based on the one or more violating locations; and
   causing performance of a corrective action associated with fabrication process equipment based on the instance of abnormality.

9. The system of claim 8, the operations further comprising:
   altering at least one of an operation of a machine or an implementation of a process associated with the instance of abnormality.

10. The system of claim 8, wherein at least one of the associated reference rate of change of the parameter value is determined by performing an analysis of variance (ANOVA) with the one or more historical rates of change of the parameter value.

11. The system of claim 8, the operations further comprising:
    determining a sample pattern associated with the one or more violating locations; and
    identifying the instance of abnormality based on the sample pattern.

12. The system of claim 8, the operations further comprising:
    retrieving one or more process dependencies of the fabrication process; and
    identifying the instance of abnormality of the fabrication process based on one or more of the process dependencies.

13. The system of claim 8, the operations further comprising:
provinding a graphical user interface (GUI) presenting a visual indicator of a machine or a process associated with the instance of abnormality.

14. The system of claim 8, the operations further comprising:
obtaining the associated reference rate of change of the parameter value of the parameter for each of the one or more locations, wherein the associated reference rate of change of the parameter value is determined using one or more historical rates of change of the parameter value from historical metrology data for the operation on one or more previous samples in the fabrication process.

15. A non-transitory machine-readable storage medium comprising instructions that, when executed by at least one processing device, cause the at least one processing device to perform operations comprising:
receiving current metrology data for an operation on a current sample in a fabrication process, the current metrology data comprising a current value for a parameter at each of one or more locations on the current sample;
determining a current rate of change of the parameter value for each of the one or more locations, the current rate of change of the parameter value associated with the current sample;
identifying one or more violating locations each having an associated current rate of change of the parameter value that is greater than an associated reference rate of change of the parameter value, wherein the associated reference rate of change is associated with one or more historical rates of change of the parameter value;
identifying an instance of abnormality of the fabrication process based on the one or more violating locations; and
causing performance of a corrective action associated with fabrication process equipment based on the instance of abnormality.

16. The non-transitory machine-readable storage medium of claim 15, wherein at least one of the associated reference rate of change of the parameter value is determined by performing an analysis of variance (ANOVA) with the one or more historical rates of change of the parameter value.

17. The non-transitory machine-readable storage medium of claim 15, the operations further comprising:
determining a sample pattern associated with the one or more violating locations; and
identifying the instance of abnormality based on the sample pattern.

18. The non-transitory machine-readable storage medium of claim 15, the operations further comprising:
retrieving one or more process dependencies of the fabrication process; and
identifying the instance of abnormality of the fabrication process based on one or more of the process dependencies.

19. The non-transitory machine-readable storage medium of claim 15, the operations further comprising:
providing a graphical user interface (GUI) presenting a visual indicator of a machine or a process associated with the instance of abnormality.

20. The non-transitory machine-readable storage medium of claim 15, the operations further comprising:
obtaining the associated reference rate of change of the parameter value of the parameter for each of the one or more locations, wherein the associated reference rate of change of the parameter value is determined using one or more historical rates of change of the parameter value from historical metrology data for the operation on one or more previous samples in the fabrication process.

* * * * *